(12) United States Patent
Behera (10) Patent No.: US 10,777,730 B2
(45) Date of Patent: Sep. 15, 2020

(54) SCALABLE PIEZOELECTRIC LINEAR ACTUATOR

(71) Applicant: Santosh Kumar Behera, San Jose, CA (US)

(72) Inventor: Santosh Kumar Behera, San Jose, CA (US)

(*) Notice: Subject to any disclaimer, the term of this patent is extended or adjusted under 35 U.S.C. 154(b) by 490 days.

(21) Appl. No.: 15/854,703

(22) Filed: Dec. 26, 2017

(65) Prior Publication Data

US 2019/0198749 A1 Jun. 27, 2019

(51) Int. Cl.
| | |
|---|---|
| *H01L 41/09* | (2006.01) |
| *H01L 41/187* | (2006.01) |
| *H01L 41/04* | (2006.01) |
| *H02N 2/02* | (2006.01) |
| *H01L 41/047* | (2006.01) |
| *H01L 41/193* | (2006.01) |
| *H01L 41/08* | (2006.01) |

(52) U.S. Cl.
CPC .......... *H01L 41/094* (2013.01); *H01L 41/042* (2013.01); *H01L 41/0477* (2013.01); *H01L 41/0825* (2013.01); *H01L 41/0946* (2013.01); *H01L 41/1876* (2013.01); *H01L 41/193* (2013.01); *H02N 2/02* (2013.01)

(58) Field of Classification Search
CPC ............... H01L 41/094; H01L 41/0477; H01L 41/0825; H01L 41/193; H01L 41/0946; H01L 41/1876; H01L 41/042; H02N 2/02
See application file for complete search history.

(56) References Cited

U.S. PATENT DOCUMENTS

| | | | |
|---|---|---|---|
| 5,633,554 A | 5/1997 | Kaji | |
| 6,154,000 A * | 11/2000 | Rastegar | B25J 9/1635 318/632 |
| 7,692,366 B2 * | 4/2010 | Thiesen | B60C 23/041 310/339 |
| 8,979,065 B2 | 3/2015 | Zhelyaskov et al. | |
| 9,644,624 B2 | 5/2017 | Tanaka | |
| 2002/0149296 A1 * | 10/2002 | Fujii | B41J 2/14233 310/328 |
| 2010/0194238 A1 | 8/2010 | Frick et al. | |
| 2012/0098468 A1 * | 4/2012 | Johansson | H02N 2/021 318/116 |
| 2012/0169181 A1 * | 7/2012 | Lee | H01L 41/0986 310/323.16 |
| 2014/0077659 A1 | 3/2014 | Hwu et al. | |

* cited by examiner

*Primary Examiner* — Bryan P Gordon
(74) *Attorney, Agent, or Firm* — Kanika Radhakrishnan; Evergreen Valley Law Group (57) ABSTRACT

Disclosed is a scalable piezoelectric linear actuator. The linear actuator includes a central rod and one or more bending modules connected to the central rod. Each of the one or more bending modules includes one or more bending actuators. Each of the one or more bending actuators includes at least two layers of bending elements. Further, each of the one or more bending actuators incudes a metallic layer disposed between each of the at least two layers of bending elements. Further, each of the one or more bending actuators includes an insulating layer disposed on at least one of the at least two layers of bending elements. Further, each of the one or more bending actuators includes a sensing element disposed on the insulating layer.

20 Claims, 7 Drawing Sheets

SCALABLE PIEZOELECTRIC LINEAR ACTUATOR

TECHNICAL FIELD

The present disclosure relates generally to linear actuators and, more particularly to, a scalable piezoelectric linear actuator.

BACKGROUND

A linear actuator converts a given input energy, such as electric, pneumatic, or hydraulic energy, into mechanical motion along a straight line. Conventionally, linear actuators have been based on magnetic actuators like solenoids or have used a mechanism to convert rotary motion of a DC motor into linear motion like the lead screw mechanism or a cam arrangement. With the advancement in piezoelectric devices, some linear actuators have been designed using piezoelectric materials. The stack actuator is the simplest and the most common piezoelectric linear actuator which consists of multiple piezoelectric discs stacked together. The displacement of each layer of discs adds up resulting in the final displacement. However, in spite of having multiple layers, the maximum displacement of a typical stack actuator is limited to a few microns which is substantially low for most of the practical applications.

Some researchers have added amplification mechanisms to a stack actuator to increase the stroke length. For example, some piezoelectric linear actuators employ bridge type flexure mechanism for displacement amplification of stack actuators. However, the corresponding drawback of such bridge type stroke amplification mechanisms is that the force output is reduced substantially as a result. In other examples, some piezoelectric linear actuators employ hydraulic amplification mechanisms for displacement amplification; however, one of the primary drawbacks of hydraulic amplification mechanisms is that they are prone to leakage. Moreover, having mechanical components like moving pistons, valves and pumps further intensifies reliability concerns.

Furthermore, most of the linear actuators encountered in commercial or industrial use utilize friction to achieve linear motion therein. For example, a rotating DC motor with a lead screw mechanism relies on friction between the threads of the lead screw and the nut or the bearings to transform the rotary motion to a linear motion. Even most of the piezoelectric linear actuators such as Piezo-Walk® are progressive motion devices which rely on friction between a guide and actuating elements to push the guide forward in successive steps. Because of friction between its components, such linear actuators may have high wear and tear, and may even lead to failure of the device.

From the above discussion it may be understood that there are a few shortcomings of existing linear actuators and piezoelectric actuators in particular. Since the linear motion is achieved through a series of steps, their speeds are limited, especially for fast oscillatory motion. Existing piezoelectric linear actuators need custom electronic circuits with multiple drive signals since the motion of the various elements have to be coordinated sequentially to produce the desired linear motion. Further, since they are friction based, they are expected to have high wear and tear, and large amount of energy dissipation as heat.

In light of the foregoing discussion, there exists a need to overcome the aforementioned drawbacks of conventional linear actuators and develop a linear actuator capable of providing oscillatory motion up to a few kHz with displacement in the millimeter range along with the capability of scaling the force output to a desired level.

SUMMARY

Various embodiments of the present disclosure provide a scalable piezoelectric linear actuator.

In one aspect, a linear actuator is disclosed. The linear actuator includes a central rod and one or more bending modules connected to the central rod. Each of the one or more bending modules includes one or more bending actuators. Each of the one or more bending actuators includes at least two layers of bending elements. Further, each of the one or more bending actuators incudes a metallic layer disposed between each of the at least two layers of bending elements. Further, each of the one or more bending actuators includes an insulating layer disposed on at least one of the at least two layers of bending elements. Further, each of the one or more bending actuators includes a sensing element disposed on the insulating layer.

In another aspect, a linear actuator is disclosed. The linear actuator includes a central rod and one or more bending modules connected to the central rod. Each of the one or more bending modules includes one or more bending actuators. Each of the one or more bending actuators incudes a first piezoelectric bending element and a second piezoelectric bending element. Further, each of the one or more bending actuators incudes a metallic layer disposed between the first piezoelectric bending element and the second piezoelectric bending element. The metallic layer is electrically coupled to the first piezoelectric bending element and the second piezoelectric bending element.

In yet another aspect, a linear actuator is disclosed. The linear actuator includes a central rod and one or more bending modules connected to the central rod. Each of the one or more bending modules includes one or more bending actuators. Each of the one or more bending actuators incudes one or more layers of piezoelectric bending elements constructed of PZT-5H material. Further, each of the one or more bending actuators incudes an insulating layer disposed on at least one of the one or more layers of piezoelectric bending elements. The insulating layer is composed of a polyimide material. Further, each of the one or more bending actuators incudes a sensing element disposed on the insulating layer and constructed of one or more of polyvinylidene fluoride and polyvinylidene difluoride (PVDF) material.

Other aspects and example embodiments are provided in the drawings and the detailed description that follows.

BRIEF DESCRIPTION OF THE FIGURES

For a more complete understanding of example embodiments of the present technology, reference is now made to the following descriptions taken in connection with the accompanying drawings in which.

The drawings referred to in this description are not to be understood as being drawn to scale except if specifically noted, and such drawings are only exemplary in nature.

DETAILED DESCRIPTION

In the following description, for purposes of explanation, numerous specific details are set forth in order to provide a thorough understanding of the present disclosure. It will be apparent, however, to one skilled in the art that the present disclosure can be practiced without these specific details.

Reference in this specification to "one embodiment" or "an embodiment" means that a particular feature, structure, or characteristic described in connection with the embodiment is included in at least one embodiment of the present disclosure. The appearance of the phrase "in an embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described, which may be requirements for some embodiments but not for other embodiments.

Moreover, although the following description contains many specifics for the purposes of illustration, anyone skilled in the art will appreciate that many variations and/or alterations to said details are within the scope of the present disclosure. Similarly, although many of the features of the present disclosure are described in terms of each other, or in conjunction with each other, one skilled in the art will appreciate that many of these features can be provided independently of other features. Accordingly, this description of the present disclosure is set forth without any loss of generality to, and without imposing limitations upon, the present disclosure.

Figure 1:
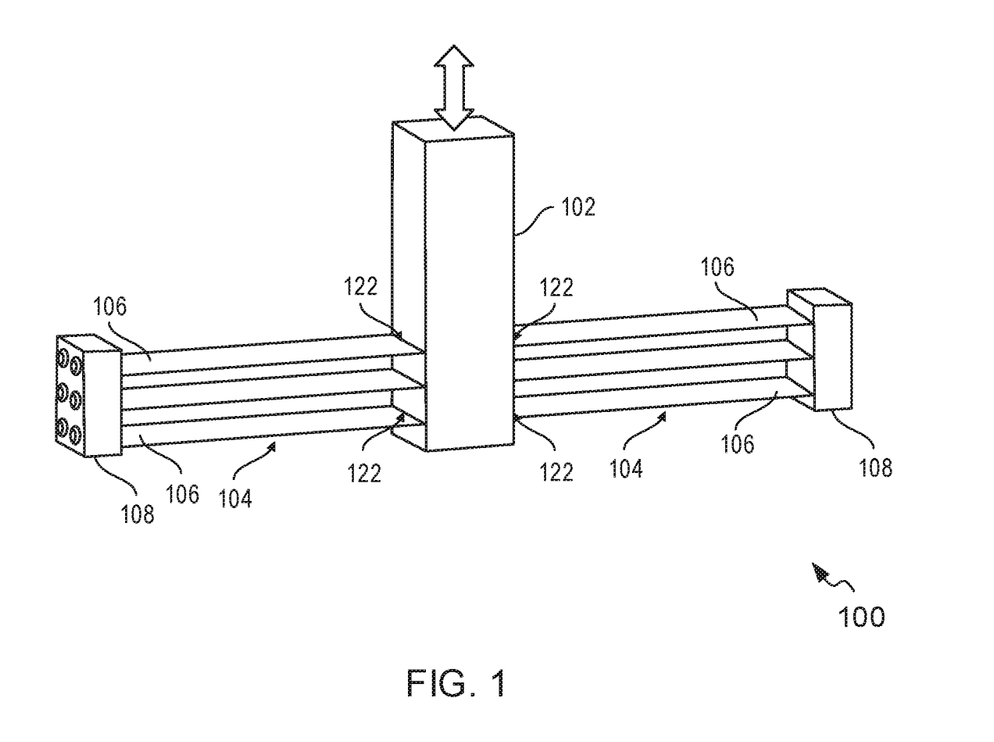
FIG. 1 is a diagrammatic view of a linear actuator, in accordance with a first example embodiment.
Figure 2:
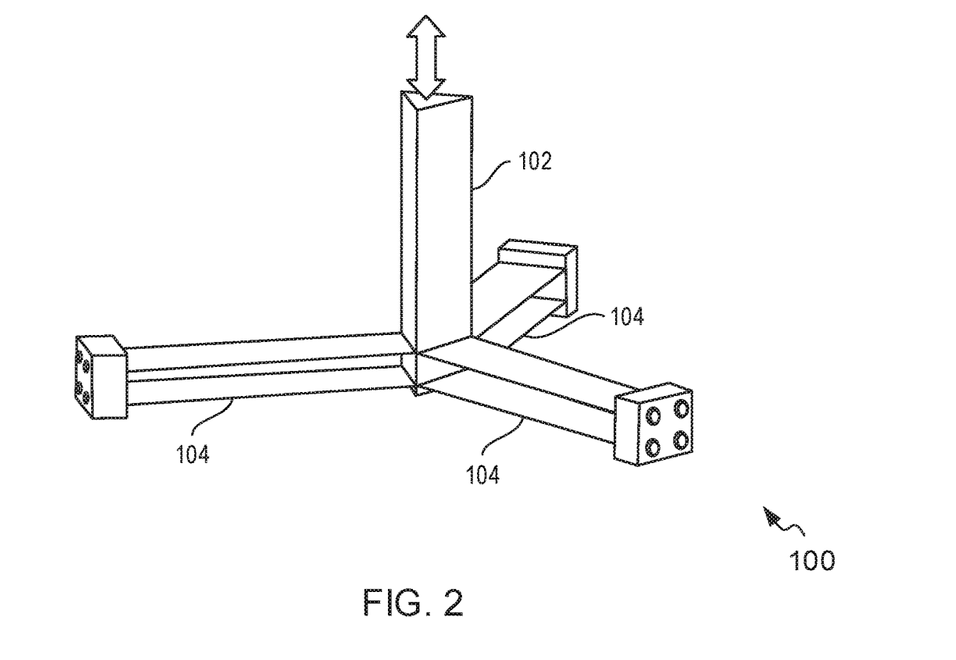
FIG. 2 is a diagrammatic view of a linear actuator, in accordance with a second example embodiment.
Figure 3:
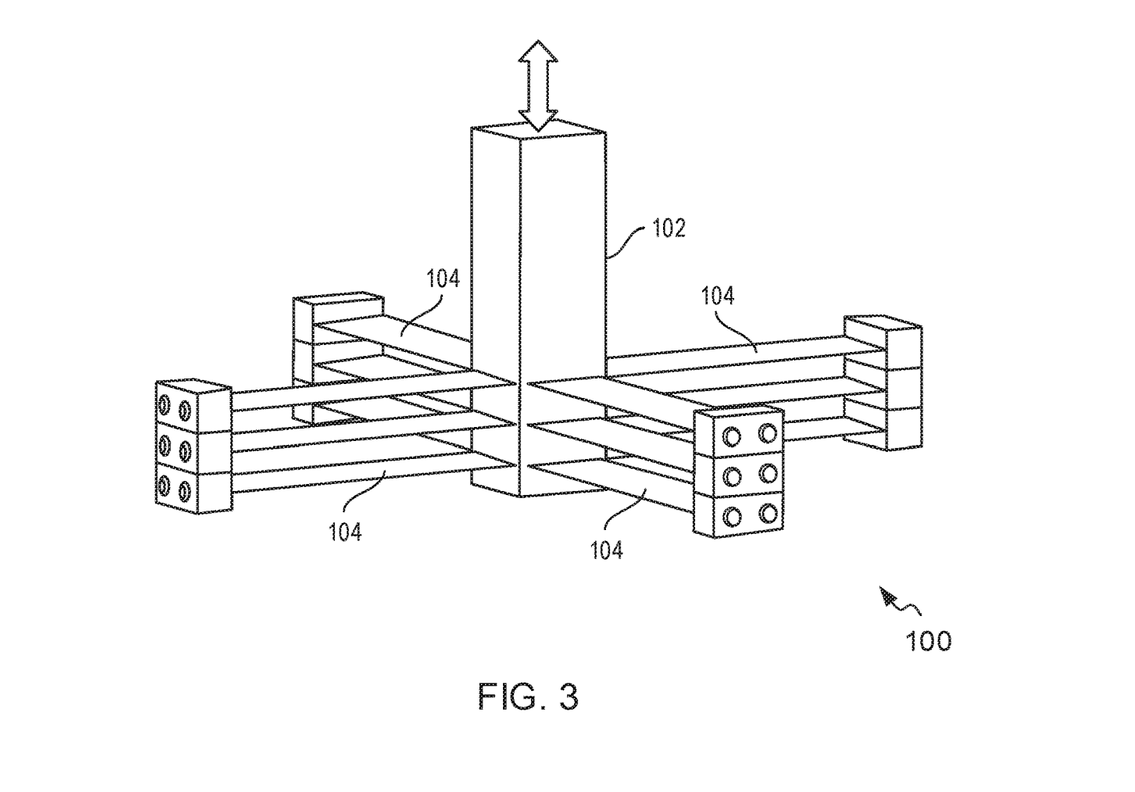
FIG. 3 is a diagrammatic view of a linear actuator, in accordance with a third example embodiment.

Referring now to the drawings, FIG. 1 illustrates a perspective view of a linear actuator (generally referenced by the numeral 100), in accordance with an embodiment of the present disclosure. The linear actuator 100, generally, includes a central rod 102 and one or more bending modules 104 coupled to the central rod 102. In the exemplary embodiment of FIG. 1, the linear actuator 100 is shown to include two bending modules 104 therein. Further, FIG. 2 and FIG. 3 illustrate alternate exemplary embodiments of the linear actuator 100 utilizing three bending modules 104 and four bending modules 104, respectively. It may be noted that for a given application, one of these illustrated designs may be chosen depending on the space constraints. The linear actuator 100 of the present disclosure may include any number of bending modules, such as the bending modules 104, depending on the application. The number of bending modules 104 in the linear actuator 100 of the present disclosure may be determined or easily modified to scale the force output of the linear actuator 100 to match the required force output for the given application, without any limitations.

In the linear actuator 100, as illustrated in the accompanied drawings, the bending modules 104 may be disposed co-axially about the central rod 102. Furthermore, the bending modules 104 may be disposed equidistant to each other around the central rod 102 so as to balance the weight of the overall assembly of the linear actuator 100. In some examples, the shape of the central rod 102 may be defined based on the number of the bending modules 104 disposed therein. For example, in case of the linear actuator 100 utilizing two bending modules 104, the central rod 102 may have a quadrilateral (e.g., a square shaped) cross-section and the two bending modules 104 may be located at any of two opposing sides of the central rod 102 (as shown in FIG. 1). Alternately, in case of the linear actuator 100 utilizing three bending modules 104, the central rod 102 may have a triangular cross-section and the three bending modules 104 may be located at corresponding three sides of the triangular central rod 102 (as shown in FIG. 2). Similarly, in case of the linear actuator 100 utilizing four bending modules 104, the central rod 102 may have a quadrilateral (e.g., a square shaped) cross-section and the four bending modules 104 may be located at corresponding four sides of the central rod 102 (as shown in FIG. 3). It may be contemplated that the described relationships between the shapes of the central rod 102 and the number of the bending modules 104 are exemplary only, and such relationships may vary depending on the design constrains and the like.

Figure 4:
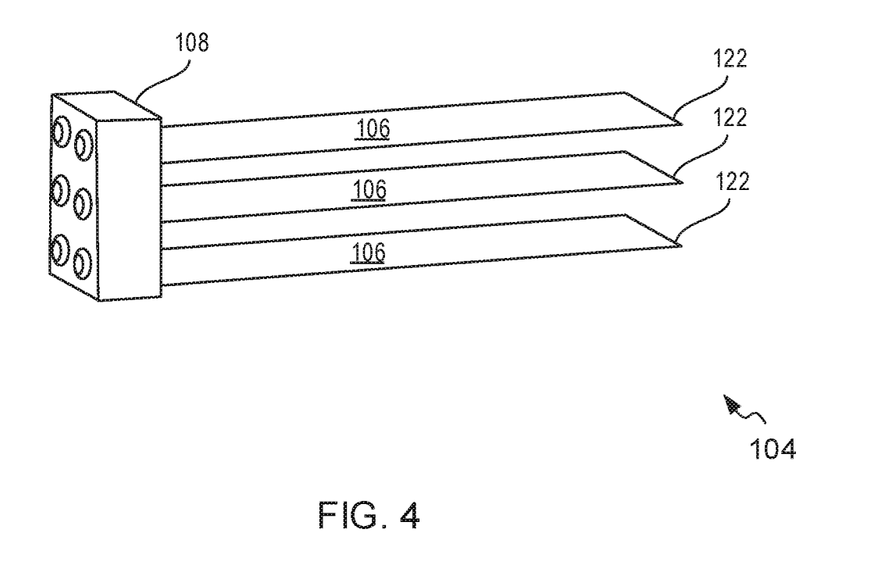
FIG. 4 is a diagrammatic view of a bending module of the linear actuator of FIGS. 1-3, in accordance with an example embodiment.

FIG. 4 illustrates a perspective view of the bending module 104 utilized in the linear actuator 100 of the present disclosure in an unassembled state, in accordance with an example embodiment. In an embodiment, each bending module 104 includes one or more bending actuators 106 supported on a support body 108 therein. In the illustration of FIG. 4, the exemplary bending module 104 is shown to include three bending actuators 106; however, it may be understood that the number of bending actuators 106 may vary based on the desired application. Further, as shown in the illustrated example, the bending actuators 106 are cantilevered on the support body 108, i.e. the one or more bending actuators 106 are supported in the form of a cantilever beam disposed one above the other. It may be contemplated that the support body 108 is formed as a unitary structure supporting the multiple bending actuators 106 thereon. The support body 108 may be constructed of any suitable insulating material, such as, but not limited to, plastic, fiberglass, asbestos, Teflon®, rubber, or any other electrically insulating polymer including polyurethane, polystyrene, etc. Although, the support body 108 is shown to have a generally cuboidal shape, it may be understood that the support body 108 may have any other suitable shape adapted for supporting the bending actuators 106, without any limitations.

Figure 5:
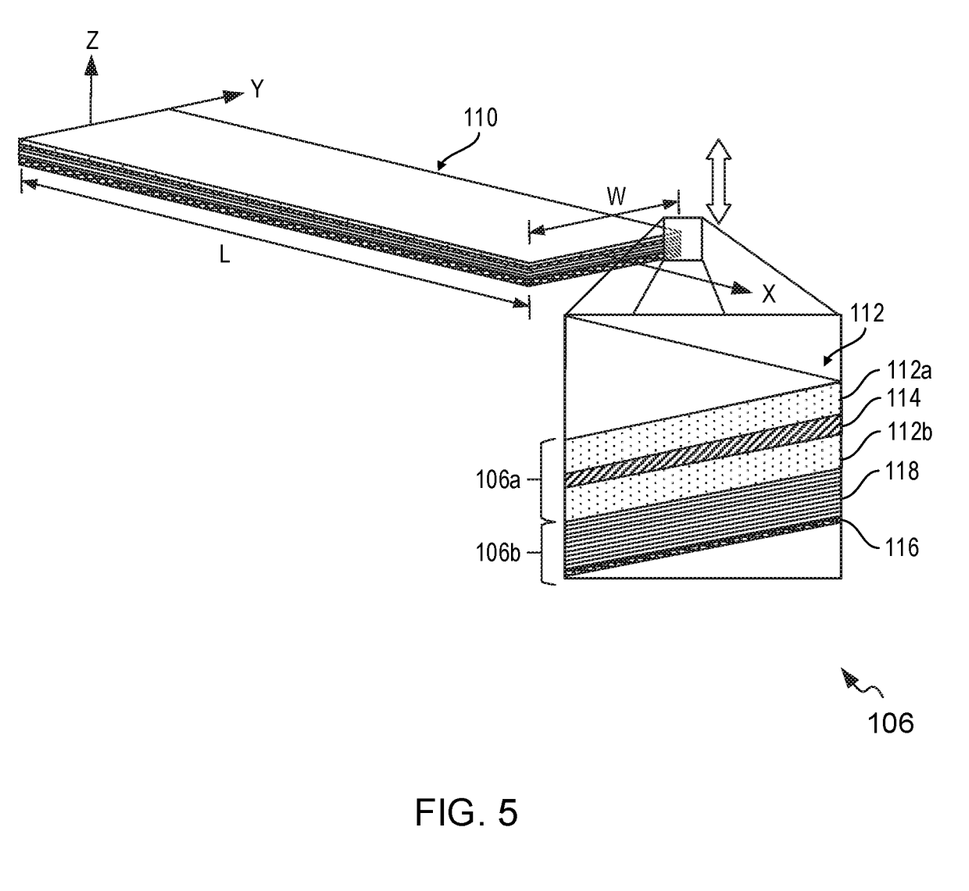
FIG. 5 is a diagrammatic view of a bending actuator of the bending module of FIG. 4, in accordance with an example embodiment.

In an embodiment, each of the bending actuators 106 is a piezoelectric actuator. In some examples, each of the bending actuators 106 is a self-sensing piezoelectric actuator. As illustrated in FIG. 5, each of the bending actuators 106 includes a stack of layers 110 having one or more bending elements 112, and a metallic layer 114 disposed between the bending elements 112 for providing support and electrical contact therebetween. Further, in some examples, the bending actuator 106 may include a sensing element 116 disposed over one of the bending element 112, and an insulating layer 118 separating the sensing element 116 from the immediate bending element 112. In the present example, the bending elements 112 and the metallic layer 114 therebetween define an actuator portion 106a of the self-sensing bending actuator 106, and the sensing element 116 herein along with the insulating layer 118 define a sensing portion 106b of the self-sensing bending actuator 106, and such combination of the actuator portion 106a and the sensing portion 106b within the single unit configures the present bending actuator 106 to be a self-sensing bending actuator.

As discussed, the bending actuator 106 is a 5-layered self-sensing actuator. In such arrangement, the bending actuator 106 includes two layers of the bending elements 112 (bimorph structure), as shown in FIG. 5. In alternate embodiments, the bending actuator 106 may include one layer of the bending element 112 (unimorph structure), or have more than two layers of the bending elements 112, without departing from the scope of the present disclosure. In FIG. 5, the actuator portion 106a of the bending actuator 106 has been shown to include two layers of the bending elements 112, a first bending element 112a (positioned at top) and a second bending element 112b (positioned lower). Each of the one or more bending elements 112 is a smart material beam that bends in response to an applied electrical signal. In the present embodiment, the bending elements 112 are piezoelectric bending elements. Although the bending actuator 106 has been described in terms of using piezoelectric layers as the bending elements 112, it may be noted that the bending actuator 106 may be realized with any other smart material, such as, but not limited to, magnetostrictive materials, electrostrictive materials, electroactive polymers and shape memory alloys with appropriate driving circuitry.

In an embodiment, the bending elements 112 are constructed of PZT-5H layers (where PZT stands for lead zirconate titanate). PZT-5H is chosen as the actuator material due to its high piezoelectric coefficient, so that the bending element 112 provides a large bending or tip displacement as well as blocked force. Herein, the blocked force is defined as the maximum force output of a bending piezoelectric actuator at a given voltage when the displacement is completely blocked. Further, ease of availability as well as low price of PZT-5H compared to other commercial piezoelectric materials makes it a suitable choice. Alternatively, the bending elements 112 may be composed of any appropriate material such as lead magnesium niobate-lead titanate solid solutions, strontium lead titanate, quartz silica, piezoelectric ceramic lead zirconate and titanate (PZT), piezoceramic-polymer fiber composites, and the like. Further, the metallic layer 114 is composed of brass material. Brass is chosen primarily because of its relatively good electrical conductivity for providing electrical contact between the two bending elements 112a, 112b, and low stiffness for allowing maximum displacement of the bending actuator 106, and further for its ability to be formed into thin sheets. Further, the sensing element 116 is constructed of polyvinylidene fluoride, or polyvinylidene difluoride (PVDF) layer. PVDF is chosen for the sensing element 116 due to its high sensing resolution, ability to be formed into micrometer-sized thin sheets and its low stiffness as it offers as little resistance as possible to the motion induced by the bending elements 112. Further, the insulating layer 118 is composed of Kapton® layer which is placed between the second bending element 112b and the sensing element 116. Kapton is a polyimide film with the chemical name poly (4,4'-oxydiphenylene-pyromellitimide), and with its good dielectric qualities, large range of temperature stability and its availability as thin sheets have made it a preferred material for use as insulating material in the present configuration. In one embodiment, the metallic layer 114, the sensing element 116 and the insulating layer 118 have relatively lower elastic stiffness compared to the layers of the bending elements 112. Further, layers of adhesive compositions may be employed to adhere the various layers with each other. It may be understood that the mentioned materials for various layers 110 are preferred materials for the bending actuator 106; however, these materials may be replaced with other suitable materials of substantially similar properties and thus shall not be construed as limiting to the present disclosure.

Figure 6:
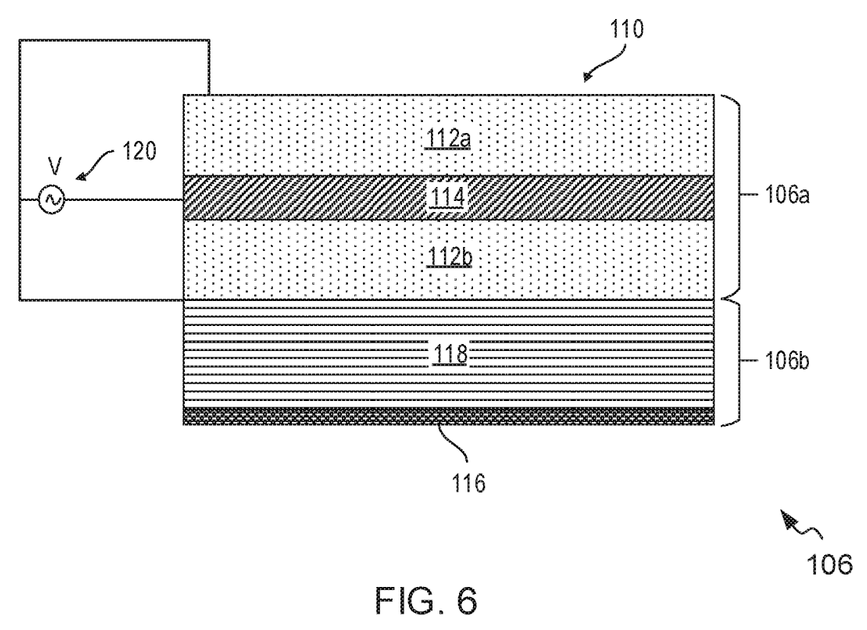
FIG. 6 is a cross-sectional view of the bending actuator of FIG. 5 showing the arrangement of various layers therein, in accordance with an example embodiment.

In the bending actuator 106, the two bending elements 112a, 112b act as the actuator layers and are responsible for generating a displacement as well as force output on the application of an electric potential. For this purpose, the two bending elements 112a, 112b are connected via an electric circuit 120, as shown schematically in FIG. 6. Specifically, in the electric circuit 120, the two outer surfaces of the bending elements 112a, 112b are connected together electrically via a conductive wire or the like. Also, the inner surfaces of the two bending elements 112a, 112b are already disposed in electrical contact via the metallic layer 114. As schematically illustrated, in the electric circuit 120, a pair of wire leads are attached to the metallic layer 114 and to at least one of the outer surfaces of the bending elements 112a, 112b in order to provide the potential difference between the two surfaces of the corresponding bending elements 112a, 112b. To actuate the bending actuator 106, a voltage is applied to these wire leads which results in a same voltage being applied across each of the two bending elements 112a, 112b. It may be contemplated that the electrical signal is generated by a computer or a function generator and is fed to the two bending elements 112a, 112b after amplification.

In the bending actuator 106, the two bending elements 112a, 112b are polarized in the same direction. Each of the bending elements 112a, 112b has orthotropic symmetry with respect to its material properties such that the material properties are the same along X and Y directions and different along Z direction. The bending elements 112a, 112b are polarized in the thickness direction, i.e. along the Z direction. When a voltage is applied across the thickness direction of each layer, it either expands or contracts. In the electric circuit 120, the wiring is done such that the inner surfaces of the two bending elements 112a, 112b are at a same first potential while the outer surfaces are at a same second potential. This ensures that the field directions are opposite to each other in the two bending elements 112a, 112b. When a positive voltage is applied, the electric field is aligned with the direction of polarization with the first bending element 112a whereas the electric field and polarization are in opposite directions for the second bending element 112b. This causes the first bending element 112a to expand and the second bending element 112b to contract resulting in a bending or up-down movement of the bending actuator 106 about a tip 122 of the overall assembly of the bending actuator 106, along the Z direction (as shown by means of a double-sided arrow in FIG. 5).

Referring back to FIGS. 1-3, it may be seen that in the linear actuator 100, various bending modules 104 are connected to the central rod 102 in a manner such that the corresponding tips 122 (see, FIG. 4) of the one or more bending actuators 106 in each of the bending modules 104 are mechanically connected to the central rod 102 therein. In other words, the tips 122 of all the bending actuators 106 in the bending modules 104 are mechanically connected to the central rod 102, which acts as the end effector in the linear actuator 100. As discussed, on application of the electric potential, the bending actuators 106 may generate a bending displacement at the corresponding tips 122. And, since the bending modules 104 are arranged symmetrically in the horizontal plane orthogonal to the central rod 102, the bending movement of the bending actuators 106 may cause the central rod 102 to move to and fro in a transverse direction (as shown by means of double-sided arrows in FIGS. 1-3). It may be contemplated that the support bodies 108 of the various bending modules 104 may be coupled to a fixed structure, to allow for the bending movement of the bending actuators 106 in each of the bending module 104.

In accordance with an exemplary embodiment, the central rod 102 may be made of an insulating material, such as, for example, ABS (Acrylonitrile Butadiene Styrene) plastic. Further, the linear actuator 100 may include a thin sheet of rubber or the like between the tips 122 of the bending actuators 106 and the central rod 102. Typically, the linear actuator 100 may be fabricated with a housing (not shown) for supporting the various components thereof. Such housing for the linear actuator 100 may be fabricated using 3D printing and is made of some insulating material, such as ABS plastic, for example. The housing is designed so as to accommodate the required number of the bending modules 104 in the linear actuator 100. Also, the housing may be designed such that the number of the bending modules 104 may be changed easily to scale the force output (discussed in later paragraphs) as required for different applications. Further, the housing is designed so that the central rod 102, acting as the end effector in the linear actuator 100, may be conveniently attached to loads or other systems for desired applications. In some examples, the bending modules 104 may be separated by spacers inside the housing. Further, in some examples, the bending modules 104 may be clamped to the housing and the clamping force used may be adjusted by a screw arrangement (not shown) provided in the housing in order to achieve proper bending movement thereof.

Figure 7:
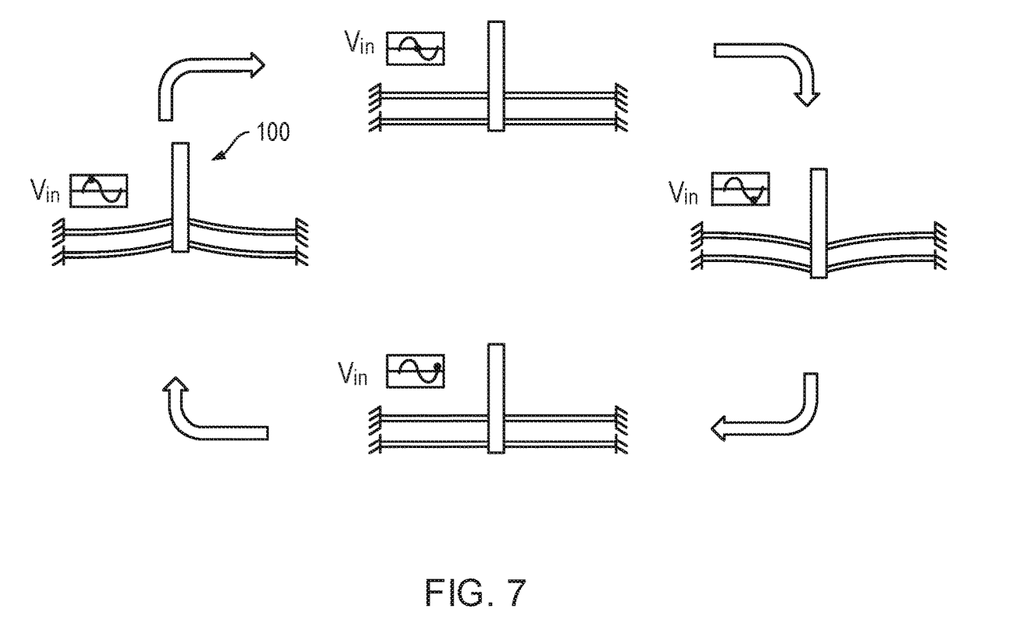
FIG. 7 is a schematic showing the working of the linear actuator, in accordance with an example embodiment.

FIG. 7 illustrates the working of the linear actuator 100 in more detail, in accordance with an example embodiment. As discussed, application of the electric potential results in the deflection of each of the bending actuators 106 in the bending module 104. In an embodiment, the bending actuators 106 in each of the bending modules 104 are wired such that all the bending actuators 106 are electrically connected in parallel and the same electrical signal (voltage) is fed as input to all the bending actuators 106 resulting in a synchronous motion. This results in the tips 122 of each of the bending actuators 106 to move up or down simultaneously in the transverse direction. As illustrated in the cyclical representation of FIG. 7, when a sinusoidal voltage is applied across the bending modules 104, the motion of the central rod 102 is oscillatory corresponding to the state of the signal at that point in time. In FIG. 7, the applied voltage signal is denoted by 'Vin', and the dot in the sinusoidal curve represents the present state of the signal. When the dot is shown at peak and trough positions of the sinusoidal curve, correspondingly the central rod 102 is at maximum upward deflection (as shown in 'Position A') and maximum downward deflection (as shown in 'Position C'), respectively. Whereas, when the dot is at base line position of the sinusoidal curve, the central rod 102 is at mean deflection (as shown in 'Position B' and 'Position D'). Therefore, it may be contemplated that the oscillatory movement of the central rod 102, along the transverse direction, may be controlled by the applied voltage in the linear actuator 100.

Figure 8:
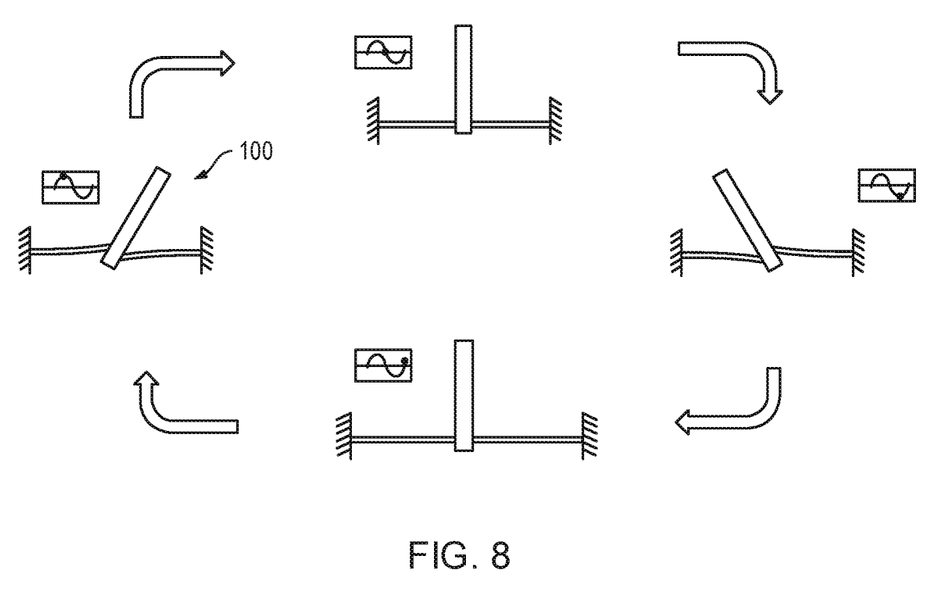
FIG. 8 is a schematic showing the working of the linear actuator, in accordance with another example embodiment.

In one example, the geometry of the linear actuator 100 may be further leveraged for other kinds of motion. One such mechanism is illustrated in FIG. 8. In such example, the bending modules 104 are again connected to the central rod 102 coaxially, however the electrical connections are made such that the bending modules 104 move in opposite directions i.e., when the bending module 104 on the left side of the central rod 102 moves up, the bending module 104 on the right side is configured to move down. Such arrangement results in a transverse movement of the central rod 102 like a pendulum pivoted at the center of the lines of contact of each bending module 104. A large displacement amplification is possible by such a mechanism. For example, in case of the linear actuator 100 of FIG. 8, multiple bending modules 104 may be arranged beside each other in a line to scale the force output.

It may be contemplated that the tip displacement of each of the bending actuator 106 is the same and equals the overall displacement of the central rod 102. Further, it may be understood that the linear actuator 100 may have the maximum displacement when the bending actuators 106 therein are operated at their resonant frequency. The linear actuator 100 of the present disclosure is configured to provide displacements up to 10 mm. However, it shall be noted that even higher displacements are possible by modifying the geometric and/or material parameters of the linear actuator 100, e.g. by increasing the length of the bending modules 104 or the like, as per the design constrains. Furthermore, the resultant force produced at the central rod 102 may be calculated by summing the contributions of all the individual bending modules 104 coupled thereto in the linear actuator 100. It may be understood that the resultant force produced by the linear actuator 100 may correspond to the number of the bending modules 104 coupled to the central rod 102 therein, as well as the number of the bending actuators 106 in each of the bending module 104. Higher the number of the bending modules 104 and/or the bending actuators 106, larger will be the force generated by the linear actuator 100 of the present disclosure. Therefore, the linear actuator 100 of the present disclosure is a scalable linear actuator as the number of the bending modules 104, or alternatively the number of the bending actuators 106 in each of the bending module 104 may be easily modified to scale the force output of the linear actuator 100, for example to match the required force output for an application.

The piezoelectric smart material based linear actuator 100 of the present disclosure with self-sensing capabilities also add functionalities that are not possible with conventional actuators and sensors. The proposed mechanism for the linear actuator 100 is capable of generating millimeter range displacement applications with the added capability to measure its own displacement. For example, the present linear actuator 100 is capable of generating maximum static displacement of 0.5 mm and maximum force output of more than 3 N for an input voltage of 100 V. Piezoelectric linear actuators that have comparable displacement output rely on friction between a guide and actuating elements to push the guide forward in successive steps. In the present linear actuator 100, since the tips 122 of the bending actuators 106 are in constant contact with the central rod 102, thus the engagement between the central rod 102 and the bending modules 104 does not explicitly rely on friction (because of absence of any surface-surface sliding) to achieve linear motion. Consequently, the linear actuator 100 has considerably less wear and tear, and thus leads to a higher reliability for the linear actuator 100 of the present disclosure. Further, the friction-independent design of the linear actuator 100 allows the central rod 102 to move considerably faster reaching oscillation frequencies in the range of hundreds of Hertz and up to a few kilohertz as compared to conventional friction based linear actuators with similar specification which may only be able to have oscillation frequencies up to few tens of hertz.

Furthermore, the present design allows the linear actuator 100 to utilize complete motion of the bending actuator 106 in moving the end effector, i.e. the central rod 102, in contrast to conventional linear actuators in which only part of the stroke is utilized for advancing the end effector, for example progressive motion piezoelectric linear actuators in which only half of the stroke of the smart material is used in advancing the end effector. Another advantage of the present linear actuator 100 compared to existing linear actuators is the ease with which the force output of the present design may be scaled by adding more bending modules 104, or increasing the number of the bending actuators 106 in the existing bending modules 104. Since the disclosed piezoelectric bending actuators 106 are fairly thin, therefore force output may be amplified considerably without much tweaking or any need for redesigning, say, the housing for the linear actuator 100.

Embodiments of the present disclosure substantially eliminate or at least partially address the aforementioned problems in the background, and provide an improved linear actuator. The linear actuator 100 of the present disclosure utilizes multiple smart material bending actuators 106 to cooperatively amplify the generated force output. The present linear actuator 100 is ideally suited to fill the gap between high force-low displacement piezoelectric actuators (e.g. stack actuators) and long travel but slow actuators (e.g. Piezo-Walk® actuators). Further, the present linear actuator 100 utilizing the self-sensing bending actuators 106 is capable of measuring the static and dynamic performance characteristics, and thus may be suitable to be used as an actuator in medical applications, such as a tissue resection device. Apart from medical applications, the linear actuator 100 may be ideally suited as the transducer in electric razors, tattoo machines, sewing machines, energy harvesting and numerous other applications where millimeter/centimeter range displacement is desired.

The embodiments illustrated and described herein as well as embodiments not specifically described herein but within the scope of aspects of the invention constitute exemplary linear actuator.

The benefits and advantages described above may relate to one embodiment or may relate to several embodiments. The embodiments are not limited to those that solve any or all of the stated problems or those that have any or all of the stated benefits and advantages.

The above description is given by way of example only and various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

What is claimed is:

1. A linear actuator, comprising:
   a central rod; and
   one or more bending modules connected to the central rod, each of the one or more bending modules comprising one or more bending actuators, each of the one or more bending actuators comprising:
      at least two layers of bending elements;
      a metallic layer disposed between each of the at least two layers of bending elements;
      an insulating layer disposed on at least one of the at least two layers of bending elements; and
      a sensing element disposed on the insulating layer.

2. The linear actuator as claimed in claim 1, wherein the one or more bending modules are arranged coaxially about the central rod.

3. The linear actuator as claimed in claim 2, wherein the one or more bending modules are arranged equidistant to each other about the central rod.

4. The linear actuator as claimed in claim 1, wherein the one or more bending modules are disposed orthogonal to the central rod.

5. The linear actuator as claimed in claim 4 further comprising an electric circuit configured to apply a voltage across the at least two layers of bending elements to cause a bending movement of the one or more bending actuators, wherein the bending movement of the one or more bending actuators causes a linear motion of the central rod in a transverse direction.

6. The linear actuator as claimed in claim 1, wherein the one or more bending actuators in the one or more bending modules are connected to the central rod at corresponding tips.

7. The linear actuator as claimed in claim 6 further comprising an electric circuit configured to apply a voltage across the at least two layers of bending elements to cause a bending movement of at least one of the one or more bending actuators at corresponding tips therein, wherein the bending movements of at least one of the one or more bending actuators causes a motion of the central rod in a transverse direction.

8. The linear actuator as claimed in claim 1, wherein each of the at least two layers of bending elements is a piezoelectric bending element.

9. The linear actuator as claimed in claim 8, wherein each of the at least two layers of bending elements is constructed of PZT-5H material.

10. The linear actuator as claimed in claim 1, wherein the metallic layer is composed of brass material.

11. The linear actuator as claimed in claim 1, wherein the insulating layer is composed of a polyimide material.

12. The linear actuator as claimed in claim 11, wherein the polyimide material is Kapton.

13. The linear actuator as claimed in claim 1, wherein the sensing element is constructed of one of more of polyvinylidene fluoride and polyvinylidene difluoride (PVDF) material.

14. A linear actuator, comprising:
   a central rod; and
   one or more bending modules coaxially disposed about and connected to the central rod, each of the one or more bending modules comprising one or more bending actuators, each of the one or more bending actuators comprising:
      a first piezoelectric bending element;
      a second piezoelectric bending element; and
      a metallic layer disposed between the first piezoelectric bending element and the second piezoelectric bending element, the metallic layer being electrically coupled to the first piezoelectric bending element and the second piezoelectric bending element.

15. The linear actuator as claimed in claim 14 further comprising an insulating layer disposed on the second piezoelectric bending element.

16. The linear actuator as claimed in claim 15 further comprising a sensing element disposed on the insulating layer.

17. The linear actuator as claimed in claim 16, wherein at least one of:

the first piezoelectric bending element and the second piezoelectric bending element are constructed of PZT-5H material;

the metallic layer is composed of brass material;

the insulating layer is composed of a polyimide material, the polyimide material comprising Kapton; and the sensing element is constructed of one of more of polyvinylidene fluoride and polyvinylidene difluoride (PVDF) material.

18. The linear actuator as claimed in claim 14, wherein the one or more bending actuators in the one or more bending modules are connected to the central rod at corresponding tips.

19. The linear actuator as claimed in claim 18 further comprising an electric circuit configured to apply a voltage across the first piezoelectric bending element and the second piezoelectric bending element to cause a bending movement of at least one of the one or more bending actuators at corresponding tips therein, wherein the bending movements of at least one of the one or more bending actuators causes a linear motion of the central rod in a transverse direction.

20. A linear actuator, comprising:

a central rod; and one or more bending modules connected to the central rod, each of the one or more bending modules comprising one or more bending actuators, each of the one or more bending actuators comprising:

one or more layers of piezoelectric bending elements constructed of PZT-5H material;

an insulating layer disposed on at least one of the one or more layers of piezoelectric bending elements, the insulating layer composed of a polyimide material; and a sensing element disposed on the insulating layer and constructed of one or more of polyvinylidene fluoride and polyvinylidene difluoride (PVDF) material.

* * * * *